United States Patent [19]

Buchheit

[11] 4,100,484
[45] Jul. 11, 1978

[54] D.C. ELECTROMETER
[75] Inventor: Robert F. Buchheit, Pittsford, N.Y.
[73] Assignee: Xerox Corporation, Stamford, Conn.
[21] Appl. No.: 744,913
[22] Filed: Nov. 26, 1976
[51] Int. Cl.² ............................................. G01R 5/28
[52] U.S. Cl. ........................................ 324/32; 324/72; 355/3 R
[58] Field of Search ................... 324/32, 72, 74, 72.5, 324/109; 355/3 R, 14, 16

[56] References Cited
U.S. PATENT DOCUMENTS

| | | | |
|---|---|---|---|
| 3,611,982 | 10/1971 | Coriale et al. | 324/72 R |
| 3,851,247 | 11/1974 | Vosteen et al. | 324/72 |
| 3,887,877 | 6/1975 | Vosteen | 324/72 X |
| 3,998,538 | 12/1976 | Urso et al. | 355/3 R |

Primary Examiner—Rudolph V. Rolinec
Assistant Examiner—Vincent J. Sunderdick

[57] ABSTRACT

Apparatus and method to enable potentials applied to various operating components of an electrostatic type reproduction machine to be measured by an electrostatic voltmeter. The apparatus comprises structures designed to place the sensing element of the voltmeter in predetermined spaced relationship with the reproduction machine photoreceptor. A shutter is provided to close off the probe window when the apparatus is not in use and automatic switches are provided to couple the probe to ground to calibrate the probe and protect the probe sensing circuit in response to closure of the shutter. Remote means are provided to enable the probe to be moved into and out of operating position and to operate the shutter.

3 Claims, 10 Drawing Figures

D.C. ELECTROMETER

This invention relates to electrostatic reproduction machines, and more particularly to an improved electrostatic voltmeter for use with such machines.

As will be understood by those skilled in the art, satisfactory operation of the highly complex and sophisticated present day electrostatic copying or reproduction machines depends to a great degree on the ability of the machine field service personnel to adjust the machine components for optimum performance. Many adjustments and settings in the machine are interrelated such that too extreme an adjustment to one machine component may be detrimental to the effective operation of another machine component or components.

One tool that has proved useful in servicing machines of this type is an electrostatic voltmeter, commonly termed an electrometer. The electrometer has the ability to measure charge potentials. For example, serfive personnel may use an electrometer to measure electrostatic charge levels on the photoreceptor of a reproduction machine without touching the photoreceptor surface, and at some convenient point or points, and on the basis of such reading or readings, accurately adjust various machine components affecting the charge level, such as the charging corotron, exposure level developer bias, etc.

Electrometers for the use alluded to above are of two principal types, an a.c. type or d.c. type. In the a.c. type, an alternating signal, which incorporates a reference base, is generated by the probe element which views or scans the photoreceptor surface. This type of signal may be created for example by a rotating shutter or vane designed to periodically expose the photoreceptor surface being measured to the probe during scanning. The resulting a.c. signal is then processed to provide an appropriate readout. However, while effective, a.c. type electrometers are normally more expensive than d.c. type electrometer.

In d.c. type electrometers, a constant signal ouput, i.e. a direct current signal, representative of the charge on the photoreceptor surface being viewed, is produced. D.C. type electrometers, although less expensive, unfortunately suffer from a number of problems which reduces their attractiveness for this type of application. One is a pronounced sensitivity of the spacing, i.e. distance, between the probe and the surface of the photoreceptor. This problem is the result of the capacitance effect created in which the electrometer probe is in effect one plate of a capacitor while the photoreceptor surface is the other. In addition, d.c. type electrometers have been found to have a tendency to drift after short periods of time rendering the readings taken inaccurate.

It is therefore a principal object of the present invention to provide a new and improved d.c. type electrometer.

It is a further object of the present invention to provide an improved d.c. electrometer having reduced spacing sensitivity.

It is a further object of the present invention to provide a d.c. type electrometer incorporating means to neutralize changes in spacing between the electrometer probe and the surface being measured.

It is an object of the present invention to provide a d.c. electrometer for use with electrostatic type copiers incorporating a feed back circuit to the electrometer probe structure to neutralize spacing sensitivity.

It is an object of the present invention to provide an d.c. electrometer having improved means for calibrating the electrometer.

It is an object of the present invention to provide an improved electrometer of the d.c. type.

This invention relates to a d.c. type electrostatic voltmeter for measuring charge voltages on a xerographic plate including a probe adapted to disposition in spaced relation to the plate, the combination of: signal processing means for processing the signal output from the probe; first control means for applying a reference signal to one input of the signal processing means; second control means for applying the signal output of the probe to a second input of the signal processing means, and means to calibrate the probe without adverse affect on the balance between the first and second control means including first switch means effective when actuated to couple the signal output from the probe and the input gate of the second control means to a preset voltage reference; charge retaining means; and second switch means effective when actuated to couple the output of the signal processing means with the charge retaining means and the input gate of the first control means whereby to retain balance between the first and second control means.

Other objects and advantages will be apparent from the ensuing description and drawings in which.

Figure 1:
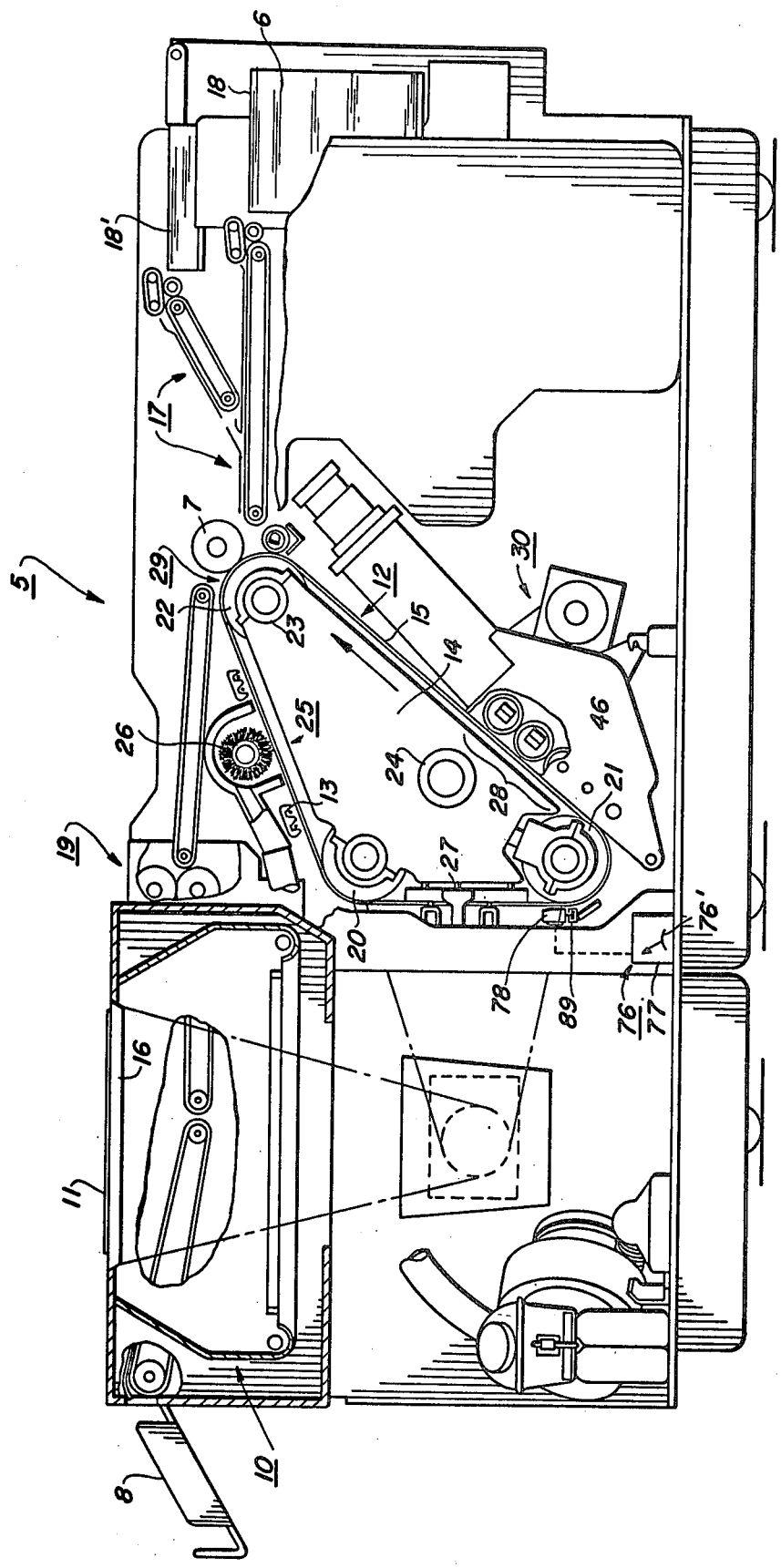
FIG. 1 is a schematic sectional view of an electrostatic reproduction machine incorporating the electrometer of the present invention.

For a general understanding of the invention, an exemplary copier/reproducton machine in which the invention may be incorporated, is shown in FIG. 1. The reproduction or copying machine, is there designated generally by the numeral 5.

A document 11 to be copied is placed upon a transparent support platen 16 fixedly arranged in an illumination assembly, generally indicated by the reference numeral 10, positioned at the left end of the machine 5. Light rays from an illumination system are flashed upon the document to produce image rays corresponding to the information areas. The image rays are projected by means of an optical system onto the photosensitive surface of a xerographic plate in the form of a flexible photoconductive belt 12 arranged on a belt assembly, generally indicated by the reference numeral 14.

The belt 12 comprises a photoconductive layer 15 of selenium which is the light receiving surface and imaging medium for the apparatus, on a conductive backing. The surface of the photoconductive belt is made photosensitive by a previous step of uniformly changing the same by means of a corona generating device or corotron 13.

The belt is journaled for continuous movement upon three rollers 20, 21 and 22 positioned with their axes in parallel. The photoconductive belt assembly 14 is slidably mounted upon two support shafts 23 and 24, with the roller 22 rotatably supported on the shaft 23 which is secured to the frame of the apparatus and is rotatably driven by a suitable motor and drive assembly (not shown) in the direction of the arrow at a constant rate. During exposure of the belt 12, the reflected light image of such original document positioned on the platen is flashed on the surface 15 of belt 12 to produce an electrostatic latent image thereon at exposure station 27.

The electrostatic latent image on the moving belt 12 passes through a developing station 28 in which there is positioned a magnetic brush developing apparatus, generally indicated by the reference numeral 30, and which provides development of the electrostatic image by means of multiple brushes as the same moves through the development zone, as more fully hereinafter described.

The developed electrostatic image is carried on belt 12 to transfer station 29 whereat a sheet 6 of copy paper is fed between transfer roller 7 and belt 12 at a speed in synchronism with the moving belt to transfer the developed image to sheet 6 without blurring. A sheet transport mechanism, generally indicated at 17, brings sheets 6 from paper supply tray 18 or 18' to the transfer station 29 at the proper time to match the arrival of the sheet with the arrival of the developed image on belt 12.

Following transfer, the image bearing sheet is separated from belt 12 and conveyed to a fuser assembly, generally indicated by the reference numeral 19, wherein the developed powder image on the sheet is permanently affixed thereto. After fusing, the finished copy is discharged from the apparatus into a suitable collector, i.e. tray 8. Residual toner particles and any other residue left on belt 12 are removed by brush 26 at cleaning station 25. Further details regarding the structure of the belt assembly 14 and its relationship with the machine and support therefor may be found in U.S. Pat. No. 3,730,623 issued May 1, 1973 and assigned to the same assignee.

Figure 3:
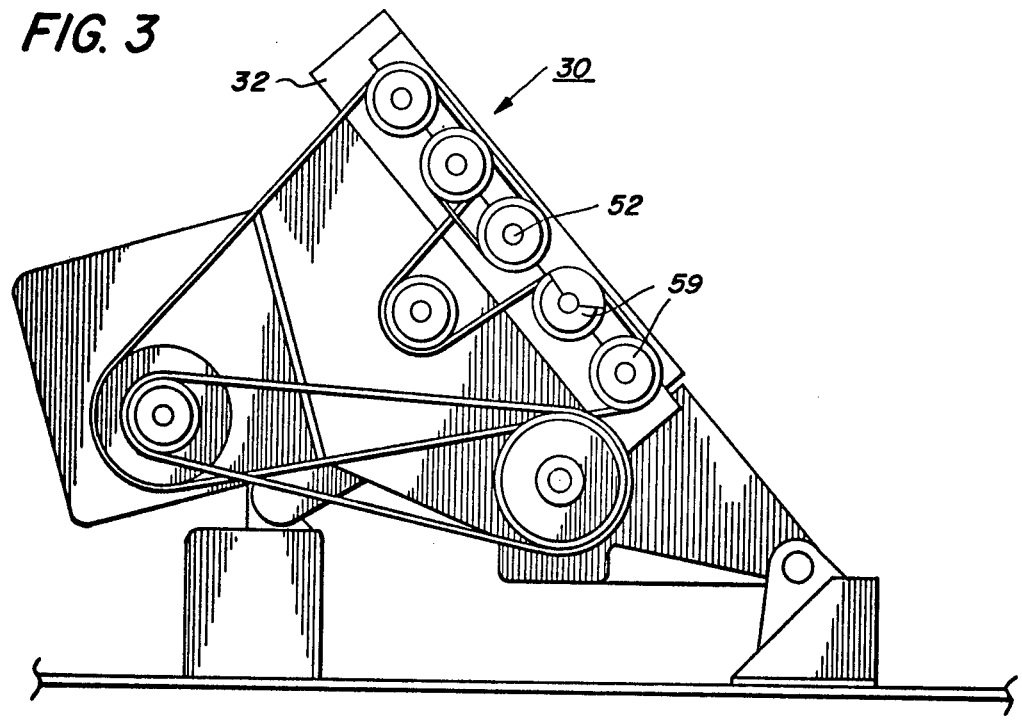
FIG. 3 is an elevational view of the opposite side of the magnetic brush developing assembly illustrating the drive mechanism for the magnetic brush roller apparatus.
Figure 2:
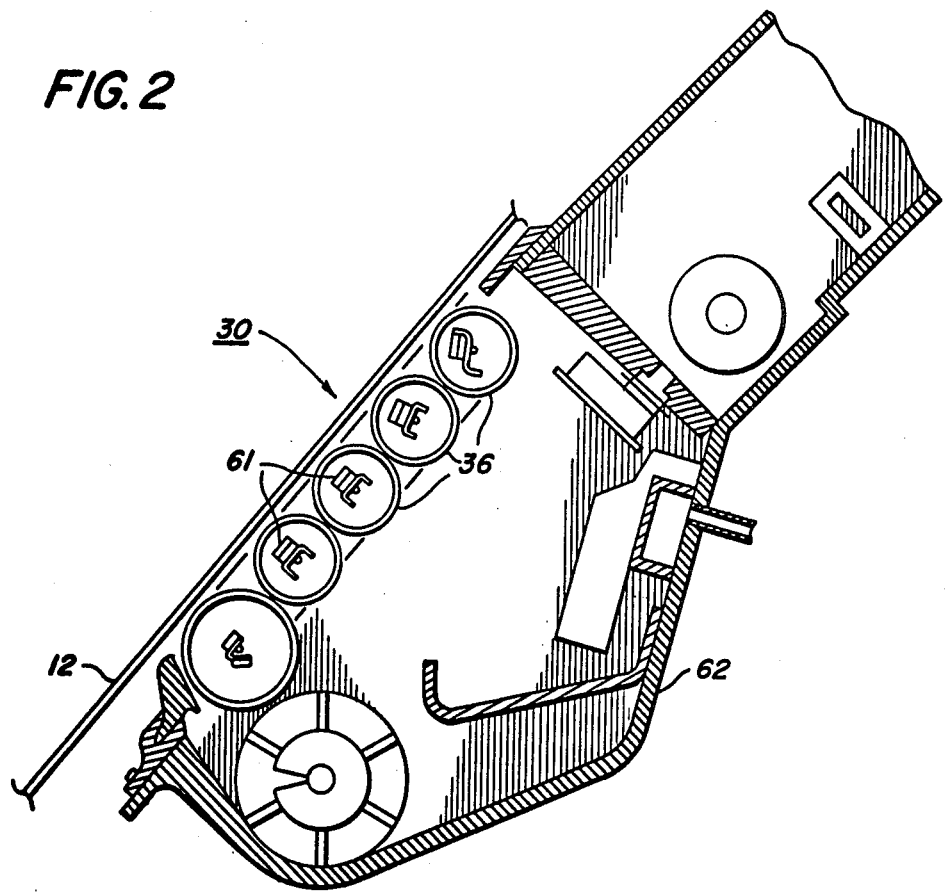
FIG. 2 is a side view of the magnetic brush developing apparatus shown in FIG. 1.
Figure 4:
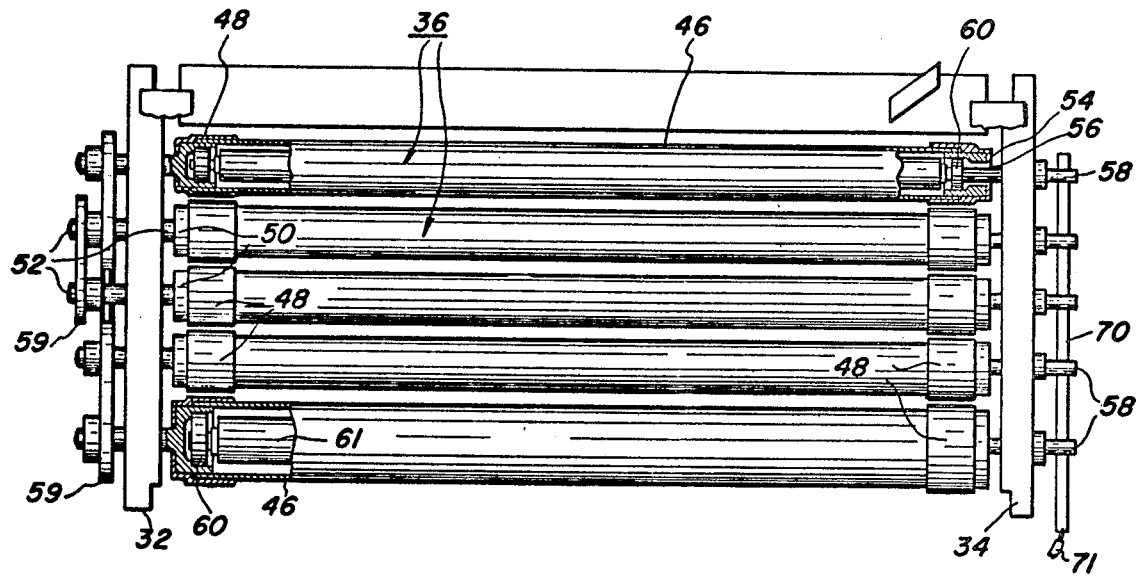
FIG. 4 is a top plan view of the magnetic brush assembly showing details of the brush bias applying mechanism.

Referring to FIGS. 2 through 4, there is illustrated a magnetic brush developing assembly, generally indicated as 30, comprising a series of rollers 36 rotatably supported in frame end plates 32, 34. The rollers 36 are each comprised of a cylindrical sleeve 46 of a roughened surface formed on a non-magnetizable material and extending almost the length of the housing of the developing apparatus 30. End sleeves 48, formed of an insulating material, are shrunk fit on the cylindrical sleeve 46 adjacent the ends thereof. One end of the sleeve 46 is closed by a cap 50 which supports a roller drive shaft 52 in coaxial alignment with the sleeve 46. The other end of the sleeve 46 is closed by a cap 54 having an orifice 56 through which extends shaft 58 of the internal bar magnets 61. Suitable bearing means 60 are provided to permit the sleeve 46 to rotate relative to shaft 58.

The roller drive shafts 52 are suitably mounted in bearings in end plate 32 and carry on their projecting ends drive sprockets 59. Sprockets 59 are formed of an insulating material.

Referring specifically to FIGS. 2 and 3, the magnet roller assembly 30 is disposed within a housing, generally indicated as 62, having a generally rectangular cross section and a length extending beyond the width of the photoconductive belt 12. Housing 62 is substantially closed except for an opening opposite photoconductive belt 12 whereat development of the latent image on belt 12 is effected. Housing 62 in effect serves as a container for developing material comprising carrier beads from magnetizable material and colored electrostatic toner particles which adhere thereto.

To provide bias to magnetic brush rollers 36, a suitable wiper 70 is provided in electrical contact with magnet shafts 58, wiper 70 extending along and being supported by side plate 34 to form an electrical path through line 71 from a suitable voltage source (not shown) to each of the roller sleeves 46.

During development, the rollers 36 are rotated in unison in the same direction from a suitable drive source via sprockets 59, the internal bar magnets 61 remaining stationary. The brush bristles produced by the influence of the magnetic field emanating from the bar magnets 61 acting upon the magnetizable carrier beads in the developing material will form on the upper region of the roller sleeves 46 adjacent the photoconductive layer 15 of belt 12.

This takes the form of a "magnetic blanket" extending continuously from one brush roller 36 to another for the entire width of the development zone 28 wherein the material is disposed or available to some degree for developing purposes. Further details regarding the formation and effect of the "magnetic blanket" are described in U.S. Pat. No. 3,640,248, issued on Feb. 8, 1972 and assigned to the same assignee.

As will be understood by those skilled in the art, development of the latent electrostatic image formed on belt 12 is dependent upon the voltage differential between the light image and the developing means. This voltage differential, which may be described as a xerographic development field, serves to attract toner to the latent electrostatic image in accordance with the image outline and density requirements to faithfully reproduce the original being copied. The strength and make-up of the xerographic development field may change with machine use and age.

To insure optimum machine performance, both initially and during the machine service life, adjustment or tuning of those machine processing components affecting the strength and make-up of the xerographic development field may be made. Such servicing may include adjusting of the power input to the corona generating device 13, adjusting the voltage bias level on magnetic brush sleeves 46, resetting the bias on the developing electrode or electrodes in an electroded developing system, etc.

The above adjustments may be performed manually and are normally performed by the machine technical or service representative who conveniently employs an electrostatic voltage measuring device, commonly termed an electrometer, and designated herein by the numeral 76. Electrometer 76, which consists of a main body 77 and probe section 78 operably interconnected by suitable electrical leads as will appear more fully herein, measures the voltage or potential on a surface. In the present application, electrometer 76 measures the charge on the surface of belt 12. Electrometer 76 may include a meter 76' to indicate visually the voltage being read. Alternately, an automatic control may be provided wherein the output of the electrometer 76, reflecting the voltage level of the area measured, i.e., belt 12, is used to adjust the power input or bias to one or more of the machine process components such as described above.

Figure 5:
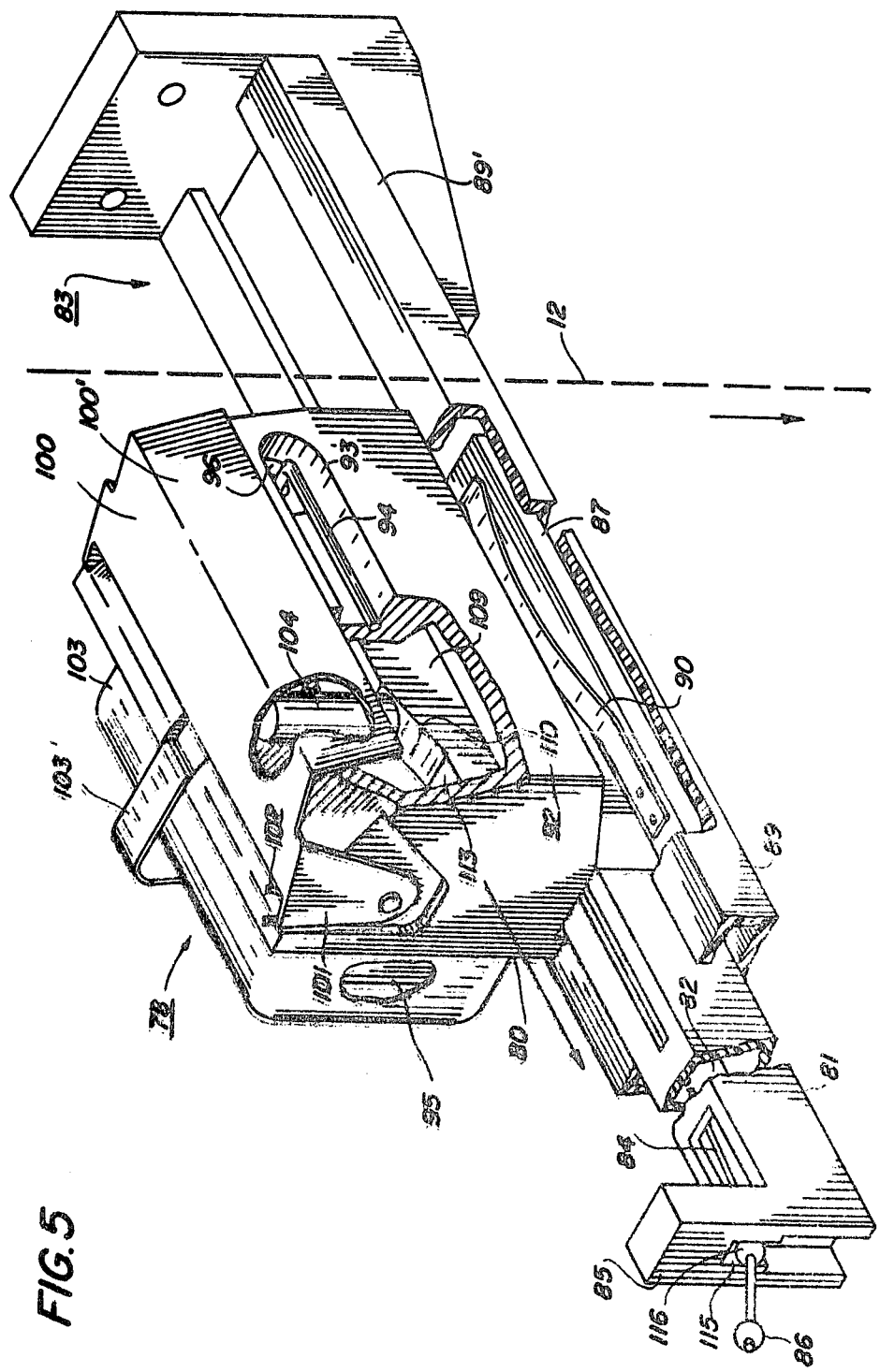
FIG. 5 is an isometric view showing details of the probe section and support therefore of the present invention.

Referring to FIGS. 1 and 5, electrometer probe section 78 includes a substantially closed generally rectangularly shaped housing 80 mounted on an elongated arm 81. The probe circuit board 95 is disposed within shielded housing 103 attached to the rear side of housing 80 by spring 103'. Arm 81 is of sufficient length to permit the probe housing 80 to be moved laterally back and forth across belt 12 and to a probe storage position 83 outside the track of belt 12 when the electrometer 76 is not in use as will appear. Arm 81 is generally rectangular when viewed in cross section, the hollow interior 82 thereof being utilized to house the operating cable 84 for probe shutter 100. One terminal end of arm 81 is formed with an upstanding part or handle 85 to permit the arm 81 to be manually grasped when it is desired to move the probe housing 80 into or out of operative position. A knob 86, which projects outwardly below handle 85 for grasping by the user, is coupled to cable 84 to permit the cable to be pulled outwardly and open shutter 100 as will be described herein. A suitable i.e. turn spring (not shown) is provided to return cable 84 to the shutter closed position.

Arm 81 includes a pair of outwardly projecting supports 87 on either side thereof, supports 87 being slidably received in a complementarily configured track member 89. Member 89 is preferably formed from metal and grounded to the frame of machine 5. To preclude shorting of probe 78 to ground through track member 89, supports 87 are preferably formed from an electrical insulating material such as plastic. A spring member 90 on each support 87 restrains movement of the probe. Track member 89 is suitably mounted within machine 5 in predetermined spaced relation to the surface of the belt 12, member 89 projecting substantially transversely to belt 12. The length of track member 89 is such that member 89 extends across the width of belt 12 and for a distance therebeyond, the latter segment 89' of member 89 comprising the nonoperative storage position 83 for the probe section 78.

In the exemplary arrangement shown, track member 89 is disposed below and under the optical field of exposure station 27. In this disposition, electrometer 76 can be used to measure the effective charge placed on the photoconductive surface 15 of belt 12 both before and after exposure has taken place. Other dispositions of track member 89 and the electrometer probe section 78 may be envisioned. For example, it may be desirable to read charges on belt 12 following development. In that circumstance, the electrometer probe section 78 is supported on the downstream side of developing station 30.

The side 92 of housing 80 facing belt 12 has an elongated aperture 93 therein. A wire-like probe 94 is disposed within housing 80 opposite aperture 93, probe 94 extending in the direction substantially paralleling aperture 93. Probe 94 is generally L-shaped, the depending leg of which projects into and is electrically connected to the circuit board 95 carrying the operating circuit 150 of probe assembly 78 as will appear. Insulator 96 serves to maintain the probe 94 electrically isolated from housing 80. Side 92 of housing 90 and face 100' of shutter 100 cooperate to provide a surface area which tends to eliminate or at least reduce coupling between probe 94 and adjoining surfaces such as track member 89. Probe housing 80 and shutter 100 are therefore preferably formed from a suitable conductive material such as metal.

Shutter 100 is provided to shield probe 94 from belt 12 during non-use of electrometer 76 or when calibrating electrometer 76. Shutter 100 is pivotally supported on legs 101 on housing 80 for movement of the shutter 100 into and out of covering relationship over aperture 93. Spring 102 biases shutter 100 into an aperture closing position.

To enable shutter 100 to be withdrawn and aperture 93 opened, a shutter drive pin 104 is provided in housing 80, pin 104 being supported within housing 80 for slidable reciprocating movement. Pin 104 is of the length of such that one end of pin 104 abuts the interior surface of shutter 100 while the opposite end rests on the lower surface of cam 109. Cam 109 is supported for slidable movement back and forth within arm 81. Cam 109 includes a ramp 110 designed, following predetermined movement of cam 109 in the forward direction (shown by the solid line arrow in FIG. 6) to force pin 104 upwardly opening shutter 100. Cable 84 is coupled to cam 109 such that movement of lever 86 draws cable 84 and cam 109 attached thereto forward causing ramp 110 to move under and raise pin 104 upwardly opening shutter 100.

To permit cable 84 to be releasably locked with shutter 100 raised and aperture 93 open, a slot-like recess 115 is provided in the lower portion of handle 85. An expanded section of cable 84 in th form of ball 116, the dimension of which is greater than the width of recess 115, prevents inward movement of cable 84 against the bias of the return spring (not shown) through interengagement of ball 116 with the sides of recess 115.

Figure 6:
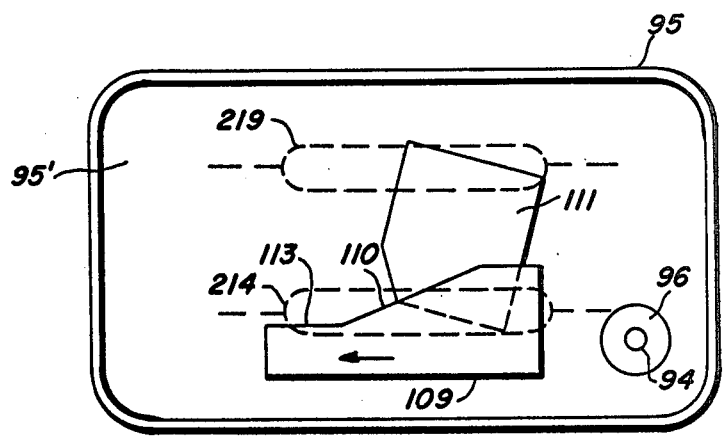
FIG. 6 is a schematic view showing details of the probe calibrating mechanism of the present invention.

As best seen in FIG. 6, cam 109 carries a switch operating magnet 111 on the switch side of cam 109. A pair of magnetic responsive switches 214, 219, commonly referred to as reed switches are provided on the interior wall 95' of circuit board 95 such that a reciprocating movement of cam 109 in opening or closing shutter 100 brings magnet into and out of operational juxtaposition with switches 214, 219. As will appear more fully herein, movement of cam 109 to open shutter 100 opens switch 214 first, then switch 219, and finally shutter 100. Movement of cam 109 in the shutter closing direction reverses the foregoing order.

Figure 7:
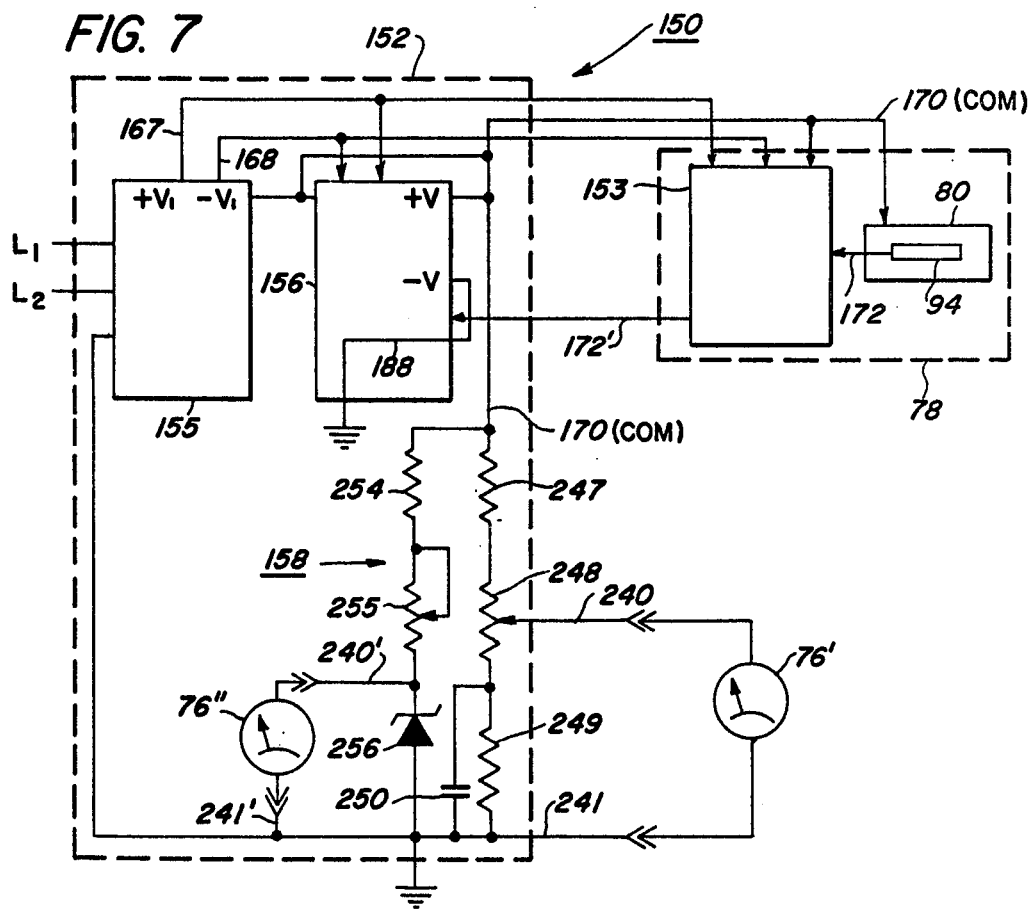
FIG. 7 is a circuit schematic showing the operating circuit of the electrometer of the present invention.

Referring now to FIG. 7, the operational circuit 150 for electrometer 76 is there shown. For convenience, circuit 150 is broken up into circuit 152 associated with the main body 77 of electrometer 76, which is remote from probe section 78, and circuit 153 associated with probe section 78. Suitable electrical leads couple the main electrometer circuit 152 with the probe circuit 153.

Main electrometer circuit 152 may in turn be broken up into power supply section 155, variable high voltage section 156, and output section 158.

Figures 8, 9:
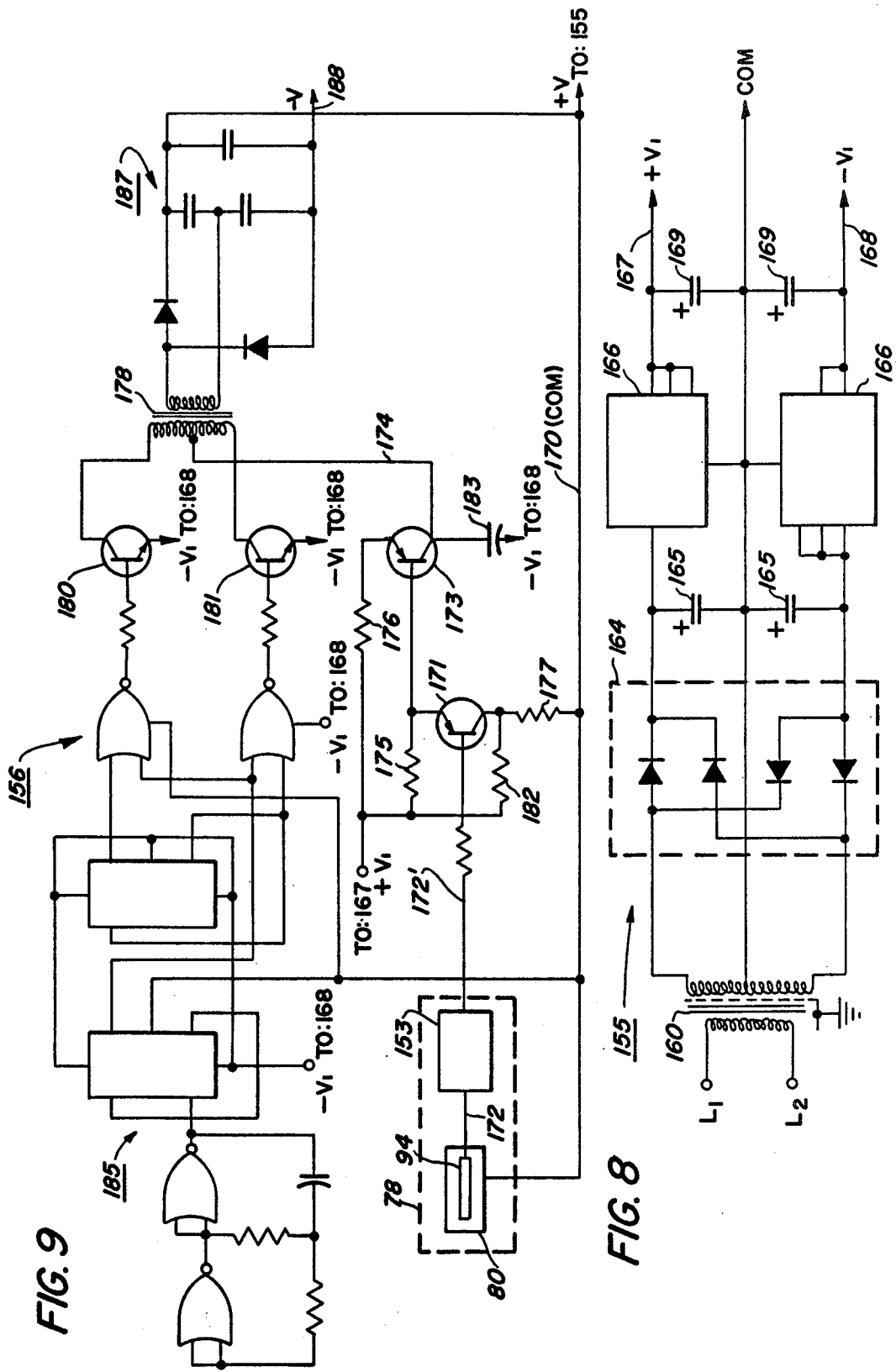
FIG. 8 is a circuit schematic of the electrometer power supply section.
FIG. 9 is a circuit schematic of the electrometer high voltage section.

Referring particularly to FIG. 8, power supply section 155 incorporates a suitable step down transformer 160, the primary winding of which is coupled across leads $L_1$, $L_2$ (typically 115 volt a.c. house current), to provide reduced line voltage. The reduced voltage output from the secondary winding of transformer 160 is coupled to an a.c. to d.c. full wave rectifier consisting of a diode bridge 164 and smoothing capacitors 165. The rectified output is fed to suitable voltage regulator pair 166 which provide predetermined plus and minus voltage outputs ($+V_1$, $-V_1$) in leads 167, 168. A typical voltage output ($V_1$) is $+12$ and $-12$ volts d.c. Regulator pair 166 may comprise any suitable commercially available voltage regulator such a model LM 326S manufactured by National SEmi-Conductor. Capacitors 169 serve to stabilize voltage regulators pair 166. As will appear, the output voltages ($+V_1$; $-V_1$) are used to drive the various operating components in circuits 152, 153. Common (com) lead 170, which is coupled to the positive output ($+V$) of high voltage section 156, comprises the bias lead to housing 80 of probe section 78 as will appear more fully herein.

Referring particularly to FIG. 9, variable high voltage section 156 is thereshown. High voltage section 156 provides an output voltage ($+V$) substantially equal to the charge measured on the photoconductive surface 15 of belt 12 as detected by electrometer 76. The voltage output of section 156 is applied to housing 80 of probe assembly 78 (through lead 170) to bias the housing 80 to a level substantially equal that of the charge voltage measured on belt 12. This reduces sensitivity of probe 94 to spacing and provides a convenient reference from which the charge on the section of belt 12 being viewed by probe 94 can be measured.

Variable high voltage section 156 includes an oscillator section 185, the output of which is used to drive a power transistor pair 180, 181. The collectors of transistors 180, 181 are coupled to the primary winding of a suitable step-up transformer 178 while the emitters of transistors 180, 181 are coupled to the negative voltage power supply line 168 ($-V_1$) of power supply section 155.

The output of the secondary winding of step-up transformer 178 is rectified by diode/capacitor voltage doubler network 187 to provide a variable positive voltage ($+V$) to lead 170 (com) and negative voltage ($-V$) to lead 188. The negative voltage lead 188 is coupled to the machine ground as shown in FIG. 7. Lead 170, as described earlier, is coupled to housing 80 of probe section 78 to place a positive bias ($+V$) on the probe housing.

Disposition of probe 94 opposite the photoconductive surface 15 of belt 12 produces a voltage signal in probe lead 172. The signal from probe 94 passes via probe circuit 153 to the base electrode of a control transistor 171. The emitter of transistor 171 is coupled to the base electrode of power transistor 173, the collector of transistor 173 being coupled by lead 174 to the center tap of transformer 178. The emitters of transistors 171, 173 respectively are coupled to the positive output terminal ($+V_1$) of power supply section 155 by lead 167 through resistors 175, 176 while the collector of transistor 173 is coupled to the negative output terminal ($-V_1$) of power supply 155 by lead 168 through capacitor 183. The collector of transistor 171 is connected to lead 170 (com) through resistor 177. Resistor 182 is disposed in parallel with transistor 171 and resistor 175 between power supply lead 167 and the emitter of transistor 171. Resistors 177, 182 serve to prevent the high voltage section 156 from being turned on when shutter 100 is closed and probe circuit 153 is in the probe calibrating mode (as will be described hereinafter), resistors 177, 182 providing an offset bias greater than the output voltage of probe circuit 153 during such calibration.

Figure 10:
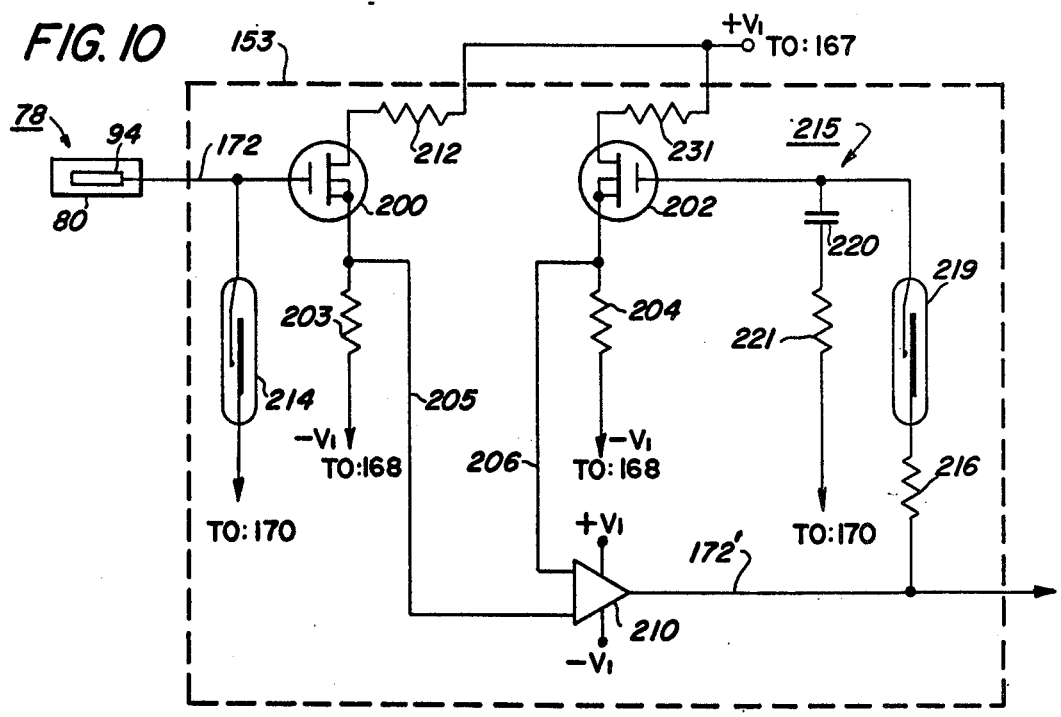
FIG. 10 is a circuit schematic of the probe circuit.

Referring to FIG. 10, the probe circuit 153 includes a pair of FET transistors 200, 202. The drain leads of transistors 200, 202 are connected to the positive lead ($+V_1$) of power supply 155 through resistors 212, 213 respectively while the source electrodes are connected by leads 205, 206 to the input gates of an operational amplifier 210. Resistors 203, 204 couple the source leads of transistors 200, 202 respectively to the negative lead 168 of power supply section 155. The output of amplifier 210, which appears in lead 172', is inputted to transistor 171 of variable high voltage circuit 156. The output of probe 94 in probe assembly 78 is also provided to the gate lead of transistor 200.

Due to the capitance relationship between the surface of the photosensitive belt 12 and probe 94 spaced opposite thereto, a voltage is induced on probe 94. This induced voltage, 94 which reflects the charge voltage on the portion of the photoconductive surface 15 of belt 12 viewed by probe 94, is passed via probe circuit 153 to the high voltage circuit 156 through lead 172'. Circuit 156 responds to the signal input from probe 94 to produce a voltage substantially equal the charge voltage on belt 12. The voltage output of high voltage circuit 156 is applied to the probe housing 80 to bias the probe housing to a voltage level substantially equal that of the charge on belt 12 to thereby render the probe 94 relatively insensitive to distance. At the same time, the biasing voltage produced by high voltage section 156, which represents the charge on belt 12, may be read on meter 76'.

Referring to FIG. 10, switch 214 is disposed between probe 94 and a source of reference potential such as lead 170 (COM). To enable probe 94 to be calibrated, a feedback loop 215 incorporating memory capacitor 220 is provided between lead 172' and the gate lead to transistor 202. Switch 219 in loop 215 regulates operation of the loop circuit as will appear. Memory capacitor 220 is coupled through resistor 221 to lead 170 (COM). A resistor 216 is provided between lead 172 (com) and switch 219.

Switches 214, 219 comprise magnetic actuated type switches (commonly called reed switches). In switches of this type, the switch contacts thereof are disposed in an sealed capsule, the switch contacts or portions thereof being formed from a magnetic material such that disposition of a magnet adjacent the switch induces a magnetic field causing the switch contacts to close. Removal of the magnet from the area adjacent the switch contacts permits the switch contacts to spring apart opening the switch and breaking the circuit.

Referring to FIG. 6, as described, switches 214 and 219 are mounted on circuit board 95 adjacent to the path of travel of magnet 111 carried by cam 109. Movement of cam 109 forward (in the direction of the solid line arrow) to open the shutter 100 draws magnet 111 out of magnetic relationship with switches 214, 219 opening the switches. As will appear more fully herein, switches 214, 219 and shutter 100 are opened in a preset progression on movement of cam 109 forward.

Referring to FIG. 10, switch 214 when closed couples probe 94 to lead 170 (com). Switch 219, when closed, couples the output side of amplifier 210 with the gate lead of transistor 202 via feedback loop 215. In this disposition, any spurious voltage in the high impedance side of transistor 200, occasioned for example, by leakage, switch closure, etc. is inputted to the operational amplifier 210 through lead 205 in a relatively low impedance state. Operational amplifier, 210 which essentially functions as a voltage comparator, produces an output signal in line 172' reflecting the voltage disparity (if any) between leads 205, 206. The output signal from amplifier 210 is passed by switch 219 to the gate lead of transistor 202. Transistor 202 responds to the signal input thereto to produce an output signal in lead 206 substantially equal that of the input signal appearing in lead 205. At the same time, memory capacitor 220 assumes a charge potential substantially equal the voltage in loop circuit 215.

As a result of the above, a voltage balancing action takes place in the probe circuit 153 in which any signal voltage in probe lead 172' is balanced by the voltage input of transistor 202 to amplifier 210. The balancing voltage is recorded on memory capacitor 220 so that on opening of switches 214, 219 the balance is sustained.

When electrometer 76 is in use, shutter 100 and switches 214, 219 are opened. Opening of shutter 100 exposes probe 94 to the portion belt 12 opposite thereto. Opening of switch 214 disconnects probe 94 from lead 170 and in effect couples the probe lead 172 to the input gate of transistor 200 while opening of switch 219 disables the feedback loop 215. With switch 219 opened, memory capacitor 220, which is charged to the last voltage differential appearing in feedback loop 215, serves as the source of bias to transistor 202.

Referring to FIG. 7, to permit the electrometer user, normally a copier service man or technical representative (i.e. tech rep) to read the charge voltage on the surface of belt 12 being viewed, output section 158 is provided. Output section 158, in the embodiment shown, has plural pairs of output terminals 240, 241; 240', 241' for use with either voltage (voltmeter) or current (ammeter) type meters.

Where the meter comprises a voltmeter 76', the common lead 170 (+V) from high voltage section 156 is coupled through voltage dropping resistor 247, rheostat 248, and capacitor/resistor combination 249, 250 to machine ground. In this application, meter 76' is coupled across rheostat and ground (terminals 240, 241.

Where the meter comprises an ammeter 76", the high voltage lead 170 (+V) is coupled through voltage dropping resistor 254, adjustable resistor 255, and diode 256 to machine ground. Meter 76" is in this application coupled across diode 256 (terminals 240', 241').

While the output section 158 described includes circuitry designed to permit readings by either a voltmeter or ammeter type meter it will be understood that the circuitry 158 may be limited to either type of circuit alone. Alternately, the voltage between lead 170 (com) and machine ground may be read.

When not in use, probe section 78, supported on track 89, is disposed in the out of the way or storage position 83 to one side of belt 12 (see FIG. 5). In this disposition, probe section 78 does not interfere with or block the optical image path of machine 5.

When stored, shutter 100 and switches 214, 219 of probe section 78 are closed. This protects the sensitive circuit components i.e. transistor 200, against damage due to static discharges. Handle 85 together with arm 81 is retracted, handle 85 being closely adjacent one side edge of belt 12.

To bring probe section 78 into operative position, the user grasps the handle 85 and withdraws arm 81 to locate probe section 78 in the position desired opposite belt 12. Lever 86 may then be actuated to draw cam 109 inward (in the direction of the solid line arrow in FIG. 6). As cam 109 moves, magnet 111 is withdrawn permitting switches 214, 219 to open. Ramp 110 on cam 109 engages pin 104 to force shutter 100 open against the bias of spring 102 permitting probe 94 to view the surface of belt 12 opposite thereto, Meter 76' or 76" is plugged into the appropriate terminals 240, 241 or 240', 241' in output section 158 and the meter readings taken.

Following use probe section 78 is returned to the stored position described above.

As alluded to earlier, switches 214, 219 and shutter 100 are opened in a predetermined sequence, such sequence comprising opening switch 214 first, then switch 219, and finally shutter 100. For this purpose the switch actuating magnet 111 carried on cam 109 is canted such that on movement of magnet 111 forward (in the direction of the solid line arrow in FIG. 6) the magnet mass leaves switch 214 first and thereafter switch 219. Cam 109 has a relatively long lead surface 113 ahead of ramp 110 to provide the requisite lost motion during which magnet 111 opens the switches 214, 219. Following takeup of the lost motion imposed by lead 113, ramp 110 engages pin 104 to open shutter 100.

On return of cam 109, the above described progression is reversed.

The aforedescribed progression obviates the possibility of erroneous readings from electrometer 76 and/or miscalibration thereof. Should shutter 100 be opened prior to opening of either switch 214 or 219, an erroneous charge may be introduced on memory capacitor 220 and/or on the probe-to-test surface coupling capacitor.

Opening of swtich 219 is desirable after opening of switch 214 but before opening of shutter 100 in order to permit the probe circuit to balance out any static or electrical noise induced from the opening of switch 214. As understood by those skilled in art, mechanical type switches such as switch 214 often generate electrical noise in the form of a small voltage changes or surge when opened. By opening switch 219 to the feedback loop 215 after opening switch 214, any spurious voltages resulting therefrom are accommodated by the balancing circuit and the accuracy of electrometer 76 is enhanced.

While opening of switch 219 may result in a similar voltage surge, the effect thereof on the balancing circuit is not sufficient to disrupt probe circuit balance.

While a xerographic type surface has been disclosed, it is understood that electrometer 76 may be used to measure the charge voltage on other types of surfaces.

While the invention has been described with reference to the structure disclosed, it is not confined to the details set forth, but is intended to cover such modifications or changes as may come within the scope of the following claims.

What is claimed is:

1. In a d.c. type electrostatic voltmeter for measuring charge voltages on a xerographic plate including a probe adapted for disposition in spaced relation to said plate, the combination of:
   signal processing means for processing the signal output from said probe, said signal processing means having at least two inputs;
   first control means having an input side and an output side, said first control means output side being coupled to a first input of said signal processing means to provide a reference signal to said signal processing means;
   second control means having an input side and an output side, said probe being coupled to said second control means input side, said second control means output side being coupled to a second input of said signal processing means whereby to apply the signal output of said probe to said signal processing means;

a voltage source;

said signal processing means including circuit means coupling said voltage source to the input side of said first control means, said signal processing means controlling said voltage source in response to said reference signal and the signal output of said probe to provide a voltage output to said first control means tending to balance the reference signal from said first control means to said processing means with the signal output of said probe; and means to calibrate said probe and maintain said balance between said first and second control means while said probe is not in use including first switch means effective when actuated to couple said probe and the input side of said second control means to said voltage source;

said circuit means including charge retaining means; and second switch means effective when actuated to couple said signal processing means with said charge retaining means and the input side of said first control means to produce a balancing potential on said charge retaining means whereby on use of said probe, said charge retaining means provides a voltage output tending to balance the reference signal from said first control means to said processing means with the signal output of said probe.

2. The voltmeter of claim 1 including means for actuating said first and second switches in predetermined progression.

3. The voltmeter of claim 2 in which said switch actuating means is magnetic.

* * * * *